US006822434B2

(12) United States Patent
Haslett et al.

(10) Patent No.: US 6,822,434 B2
(45) Date of Patent: Nov. 23, 2004

(54) MONOLITHIC TRANSFORMER COMPENSATED CIRCUIT

(75) Inventors: James William Haslett, Calgary (CA); Bogdan Alexandru Georgescu, Calgary (CA); John Godfrey McRory, Calgary (CA); Holly Evelyn Pekau, Calgary (CA)

(73) Assignee: Telecommunications Research Laboratories, Edmonton (CA)

(*) Notice: Subject to any disclaimer, the term of this patent is extended or adjusted under 35 U.S.C. 154(b) by 72 days.

(21) Appl. No.: 10/354,250

(22) Filed: Jan. 28, 2003

(65) Prior Publication Data

US 2003/0141953 A1 Jul. 31, 2003

Related U.S. Application Data

(60) Provisional application No. 60/351,369, filed on Jan. 28, 2002.

(51) Int. Cl.[7] .............................................. G01R 33/00
(52) U.S. Cl. ....................... 324/127; 324/117 H; 363/97
(58) Field of Search .............................. 363/87, 97, 99; 324/117 H, 127, 225; 315/224; 336/132

(56) References Cited

U.S. PATENT DOCUMENTS

| | | | | | |
|---|---|---|---|---|---|
| 3,810,136 | A | * | 5/1974 | Lang et al. ...................... | 341/6 |
| 5,019,955 | A | * | 5/1991 | Hoeksma ................. | 363/21.07 |
| 5,532,913 | A | * | 7/1996 | Suzuki et al. .................. | 363/25 |
| 2002/0145481 | A1 | | 10/2002 | Murgulescu | |
| 2002/0163375 | A1 | | 11/2002 | Wu et al. .................... | 327/356 |
| 2003/0080846 | A1 | | 5/2003 | Chang et al. ................ | 336/223 |

OTHER PUBLICATIONS

A 0–dB IL 2140 +/– 30 MHz Bandpass Filter Utilizing Q–enhanced Spiral Inductors in Standard CMOS, T. Soorapanth, S. S. Wong, IEEE Journal of Solid–State Circuits, vol. 37, No. 5, pp. 579–586, May 2002.

Extremely High–Q Tunable Inductor for Si–Based RF Integrated Circuit Applications, D. R. Pehlke, A. Burstein, M. F. Chang, IEDM 97, pp. 63–66, 1997.

On–chip high–Q (>3000) transformer–type spiral inductors, Y.–C. Wu, M. F. Chang, Electronics Letters, vol. 38, No. 3, Jan. 31, 2002.

Tuned LNA for RFICs using *boot–strapped* inductor, F. Albertoni, L. Fanucci, B. Neri, E. Sentieri, 2001 IEEE Radio Frequency Integrated Circuits Symposium, 2001.

\* cited by examiner

*Primary Examiner*—Anh Mai
(74) *Attorney, Agent, or Firm*—Christensen O'Connor Johnson Kindness PLLC

(57) ABSTRACT

A monolithic transformer compensated circuit with enhanced quality factor without significantly increasing noise levels is presented in this disclosure. The technique uses a monolithic transformer and a current source driving current into the transformer secondary winding to achieve loss compensation in the transformer primary. An ac current which is proportional to, and in phase with the voltage applied to the primary winding can be used to achieve theoretically perfect loss compensation at a given frequency in the RF (GHz) frequency range. Examples of circuit applications that are particularly suited to the technique include Voltage Controlled Oscillators (VCO's), Low Noise Amplifiers (LNA's) and Filters. The technique has the added advantage of reducing power consumption in some applications.

22 Claims, 14 Drawing Sheets

FIGURES

Lossy Resonant Circuit

Lossless Resonant Circuit

L2_VALUE=7n

L1_VALUE=7n

Transformer Compensated Resonant Circuit

Compensated Q Factor

MONOLITHIC TRANSFORMER COMPENSATED CIRCUIT

CROSS-REFERENCE TO RELATED APPLICATION

This application claims the benefit of the filing data of U.S. Provisional Application No. 60/351,369, filed Jan. 28, 2002.

BACKGROUND OF THE INVENTION

A major problem in realizing high performance monolithic wireless transceivers arises because of the low Quality (Q) Factors of on-chip inductors. A great deal of effort has been expended to improve the performance of these devices, including patterned ground shields, micromachining to reduce substrate losses, and the development of sophisticated modeling and design software aimed at optimizing the Q Factor in given applications. However, Q Factors in standard processes are limited to something less than 15 at GHz frequencies, in spite of the best efforts of the industrial and scientific communities. Attempts to replace the passive devices with active (transistor based) equivalents can be somewhat effective, but increased distortion, noise and power consumption make these circuits undesirable in battery-powered high gain applications.

SUMMARY OF THE INVENTION

A monolithic transformer compensated circuit with enhanced quality factor without significantly increasing noise levels is presented in this disclosure. The technique uses a monolithic transformer and a current source driving current into the transformer secondary winding to achieve loss compensation in the transformer primary. An ac current which is proportional to, and in phase with the voltage applied to the primary winding can be used to achieve theoretically perfect loss compensation at a given frequency in the RF (GHz) frequency range. The monolithic transformer is preferably frequency stabilized, for example with a stabilizing capacitance in parallel with the transformer secondary winding or an LC circuit in series with the current source. Examples of circuit applications that are particularly suited to the technique include Voltage Controlled Oscillators (VCO's), Low Noise Amplifiers (LNA's) and Filters. The technique has the added advantage of reducing power consumption in some applications.

BRIEF DESCRIPTION OF THE FIGURES

There will now be described preferred embodiments of the invention, for the purpose of illustration only, by reference to the drawings, in which identical reference characters denote like elements, but configured in different configurations in the respective figures, and in which:

FIG. 2b is an equivalent circuit for the circuit of FIG. 2a;

DETAILED DESCRIPTION OF PREFERRED EMBODIMENTS

In the claims, the word "comprising" is used in its inclusive sense and does not exclude other elements being present.

Figure 1:
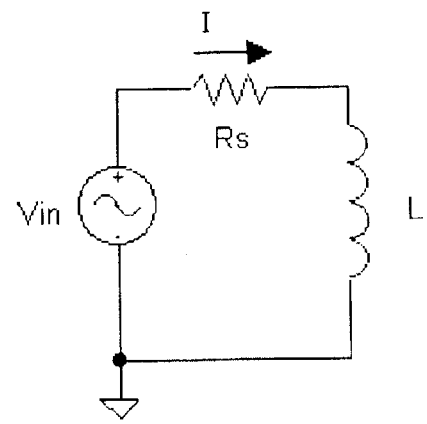
FIG. 1 is an equivalent circuit diagram of a representative lossy inductor.

An equivalent circuit diagram of a lossy inductor is shown in FIG. 1. The governing equations for this circuit are as follows:

$$I = V_{in}/(R_S + sL)$$

$$Q = \omega L/R_S$$

It is desired that Q be large, which corresponds to a small (ideally zero) value of $R_S$. In that case, $$I = V_{in}/sL$$

$$Q = \infty$$

Figure 2A:
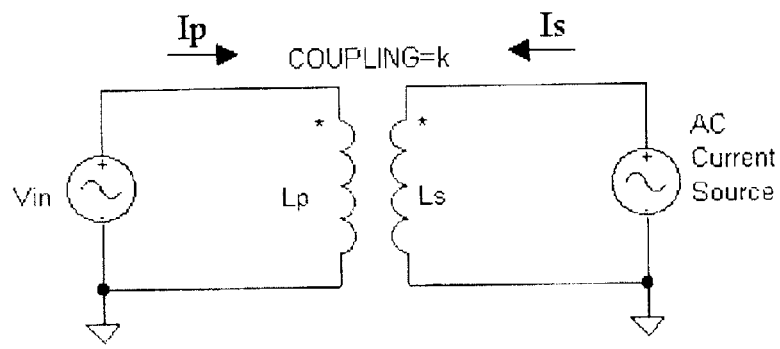
FIG. 2a shows a means of compensating losses in the inductor of FIG. 1.
Figure 2B:
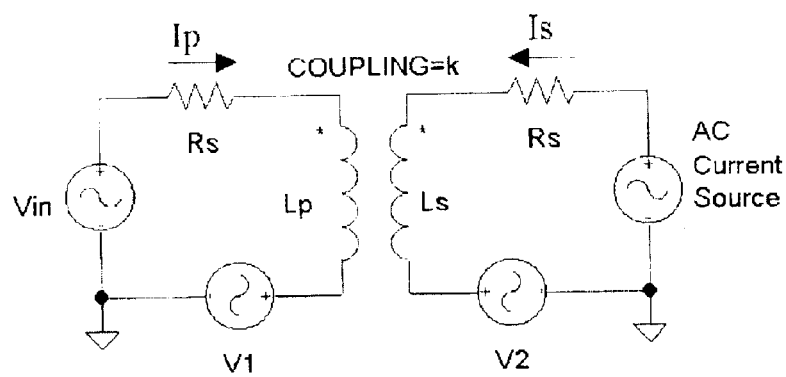

In practice, it is not possible to achieve a very small value of $R_S$, because of the resistivity of the metal used to fabricate the inductor. However, a means of compensating the loss using a transformer is shown in FIG. 2a. An equivalent circuit that models the transformer and loss components is shown in FIG. 2b. In the equivalent circuit of FIG. 2b, $$V_1 = sM_{12}I_S$$

$$V_2 = sM_{21}I_P$$

Then we can write $$V_{in} = I_P R_S + I_P s L_P + I_S s M_{12}.$$

In order for the input circuit to be purely inductive, $Re(I_P R_S + s M_{12} I_P) = 0$. In its simplest form, making $I_P R_S = -I_S s M_{12}$ sets the entire loss term to zero, so that $I_P = V_{in}/(sL_P)$, which corresponds to a lossless inductor of value $L_P$. This condition can be rearranged to yield the required secondary current $$I_S = -\frac{I_P R_S}{sM_{12}} = -\frac{V_{in} R_S}{s^2 M_{12} L_P}.$$

For sinusoidal signals s=jω and this becomes $$I_S = +\frac{V_{in} R_S}{\omega^2 M_{12} L_P},$$

which is a real quantity, and readily achievable in circuit form at RF frequencies. In general, $$M = k\sqrt{L_P L_S}$$

where k is the coupling factor between the primary and secondary windings, typically 0.7 to 0.9 for monolithic transformers in Silicon. Thus the required secondary current becomes, in the general case, $$I_S = \frac{V_{in} R_S}{\omega^2 k L_P \sqrt{L_P L_S}}.$$

If we make a unity turns ratio transformer with $L_S = L_P$ the required current reduces to $$I_S = +\frac{V_{in} R_S}{k\omega^2 L_P^2} = \frac{V_{in}}{kQ^2 R_S}$$

where Q is the quality factor of a coil with winding resistance $R_S$ and inductance $L_P$. When this current is forced through the secondary winding, the primary circuit behaves like a lossless inductor of value $L_P$, with infinite Q factor at the frequency ω. This compensation technique is useful in narrowband applications with a fixed value of $I_S$, or it can be used in wideband applications if the compensation current is made to vary as $1/\omega^2$.

Figure 3A:
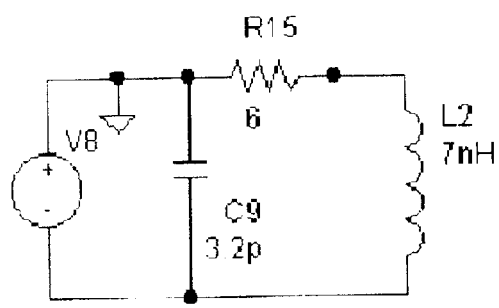
FIGS. 3a, 3b and 3c show a lossy resonant circuit, a perfect lossless circuit and a transformer compensated circuit.
Figure 3B:
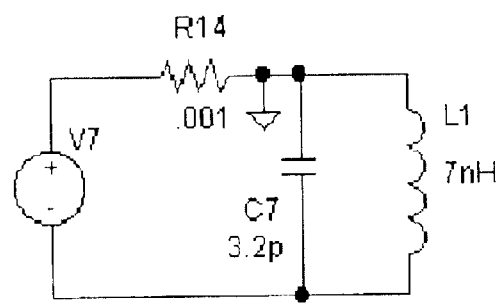
Figure 3C:
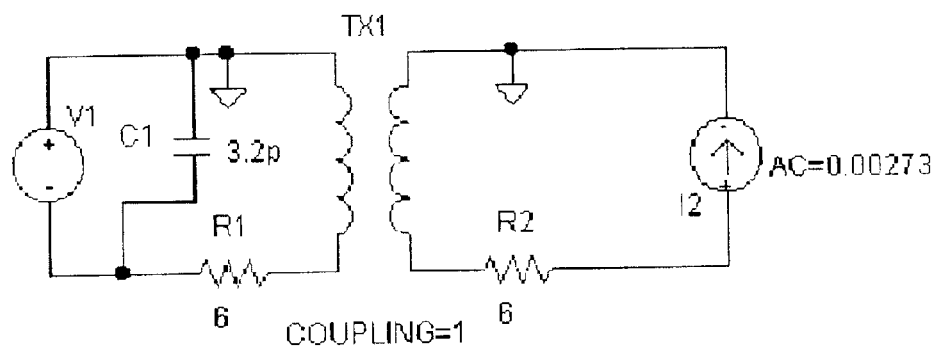

To illustrate the principle discussed, consider three different resonant circuits as shown in FIGS. 3a, 3b and 3c, which show respectively a lossy resonant circuit, a perfect lossless circuit and a transformer compensated circuit.

The values shown are typical values for a monolithic inductor resonating at approximately 1 GHz. The input currents drawn from the signal source in each case are shown in FIG. 4.

Figure 4:
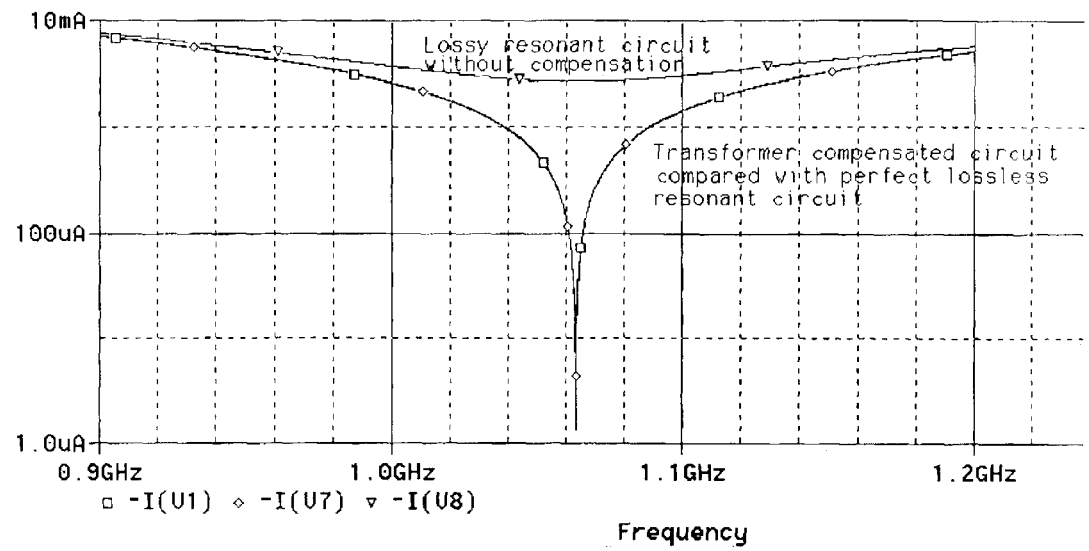
FIG. 4 shows input current for the circuits of FIGS. 3a, 3b and 3c.
Figure 4A:
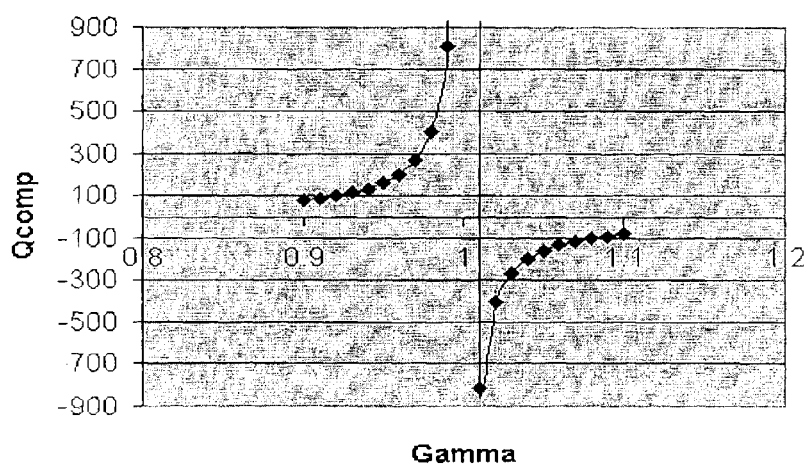
FIG. 4a shows variation of compensated Q factor with error factor $\gamma \neq 1$.

As can be seen in FIG. 4, the transformer compensated circuit behaves essentially the same as the lossless circuit. Note also that the compensation was chosen to be exactly correct at the resonant frequency only, yet the compensation is clearly effective for a range of frequencies near the resonant frequency, which is a significant advantage in the sense that it is not necessary to use a compensation current that is proportional to $\omega^{-2}$ in the narrowband case. This can be seen by analyzing the general case with a non-unity coupling factor k, and assuming an error factor γ in the secondary compensating current $I_S$, ie $$I_S = +\gamma \frac{V_{in} R_S}{k\omega^2 L_P^2},$$

where γ can be less than or greater than unity, and is ideally unity. In that case, the impedance of the transformer compensated inductor can be shown to be $$Z_{comp} = \frac{R_S(1-\gamma) + j\omega L_P\left(1 + \frac{R_S^2 \gamma}{\omega^2 L_P^2}\right)}{1 + \frac{R_S^2 \gamma^2}{\omega^2 L_P^2}}.$$

When γ=1, the compensated inductor is purely inductive, ie lossless.

In general the compensated circuit with incorrect compensating current can be likened to a new series connection of a resistor $R_{Scomp}$ and an inductor $L_{PcompSeries}$, where, by inspection of the equation for $Z_{comp}$, recognizing that $$\frac{\omega^2 L_P^2}{R_S^2} = Q^2,$$

we see that $$R_{Scomp} = \frac{R_S(1-\gamma)}{1 + \frac{\gamma^2}{Q^2}}, \text{ and } L_{ScompSeries} \frac{L_P\left(1 + \frac{\gamma}{Q^2}\right)}{1 + \frac{\gamma^2}{Q^2}}.$$

Then for convenience, this series circuit can be represented by an equivalent parallel $L_{PcompParallel}$-$R_{Pcomp}$ circuit, where $$R_{Pcomp} = R_{Scomp}(1 + Q_{comp}^2),$$

$$L_{PcompParallel} = L_{PcompSeries}\left(1 + \frac{1}{Q_{comp}^2}\right), \text{ and}$$

$$Q_{comp} = \frac{\omega L_{PcompSeries}}{R_{Scomp}}.$$

With some manipulation, it can be shown that the parallel loss resistance is $$R_{Pcomp} = R_S\left[\frac{(1-\gamma)^2 + Q^2\left(1 + \frac{\gamma}{Q^2}\right)^2}{(1-\gamma)\left(1 + \frac{\gamma^2}{Q^2}\right)}\right]$$

where $$Q = \frac{\omega L_S}{R_S},$$

the uncompensated Q-factor of the original transformer primary coil.

The effects of the compensation are best seen by comparing the compensated $R_{Pcomp}$ with the uncompensated $R_P = R_S(1+Q^2)$. Taking the ratio gives $$\frac{R_{Pcomp}}{R_P} = \frac{(1-\gamma)^2 + Q^2\left(1 + \frac{\gamma}{Q^2}\right)^2}{(1+Q^2)(1-\gamma)\left(1 + \frac{\gamma^2}{Q^2}\right)}.$$

If $Q^2 \gg 1$ this becomes $$\frac{R_{Pcomp}}{R_P} \simeq \frac{1}{(1-\gamma)}.$$

In this case, when $\gamma=1$, $R_{Pcomp}=\infty$, as required.

It can also be shown that the compensated parallel equivalent inductance is given by $$L_{PcompParallel} = L_P \frac{\left(1 + \frac{\gamma}{Q^2}\right)}{\left(1 + \frac{\gamma^2}{Q^2}\right)} \left(1 + \frac{(1-\gamma)^2}{Q^2\left(1 + \frac{\gamma}{Q^2}\right)^2}\right)$$

Again, when $\gamma=1$, $L_{PCompParallel}=L_P$, ie the value of the inductance is not affected by the compensation.

Perhaps the most important result is that the compensated Q-Factor of the primary coil is given by $$Q_{comp} = \frac{\omega L_{PcompSeries}}{R_{Scomp}} = \frac{Q}{(1-\gamma)}\left(1 + \frac{\gamma}{Q^2}\right)$$

If the original uncompensated coil $Q^2 \gg 1$, this becomes $$Q_{comp} \simeq \frac{Q}{(1-\gamma)}.$$

This means that even with a 10% error in γ, the compensated inductor has a Q factor 10 times that of the uncompensated circuit. It is also worth noting that Q can be made negative if γ>1 which allows for other losses to be compensated if they appear in parallel with the transformer primary coil. A typical variation in compensated Q factor with γ is shown below, for the case where the uncompensated Q factor is 8.

Figure 5:
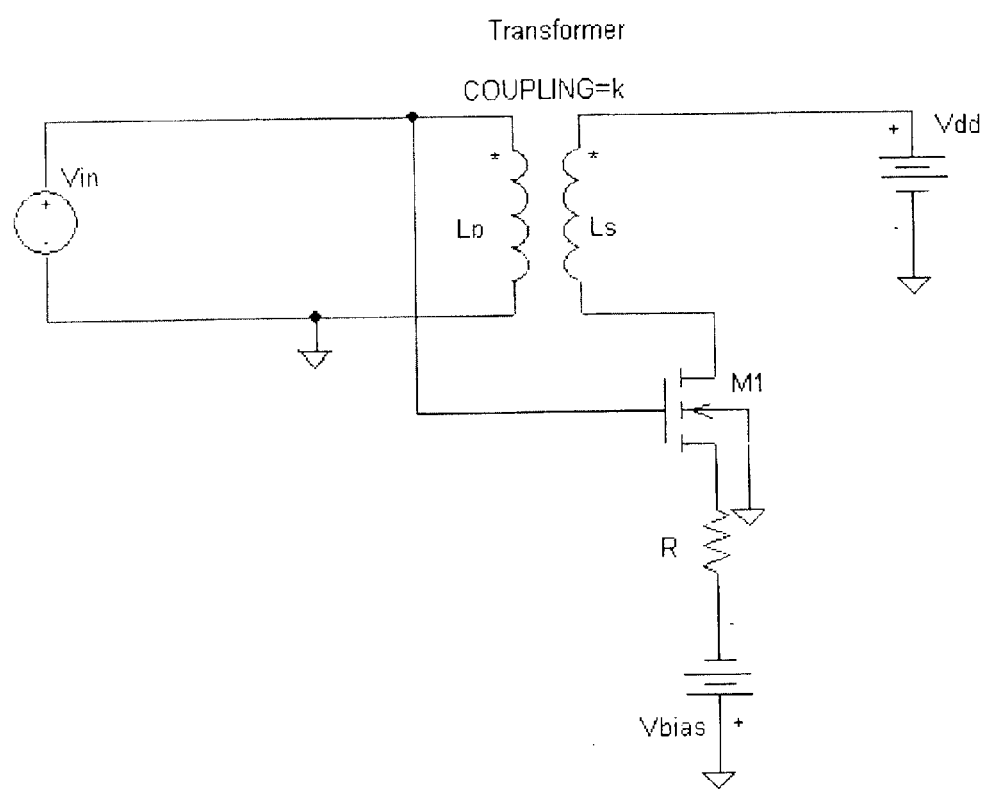
FIG. 5 shows a single inductor with compensation circuit according to the invention.

The compensation technique for a single inductor can be realized as shown in FIG. 5. In this realization, the voltage Vin is applied to the coil (Inductance Lp), and simultaneously to the gate of the source follower circuit. The resulting signal current that flows in the drain of the transistor is in phase with the voltage, and the drain of the transistor acts as a current source as required to achieve compensation. The bias voltage Vbias, the value of the resistor R and the geometry of the transistor are chosen to achieve the correct compensation current, resulting in a lossless inductor in the transformer primary leads. There are many ways of using Vin to generate the compensation current, for example by using a bipolar transistor instead of a MOS transistor. In addition, tuning of the current can be achieved by replacing the resistor R with another transistor whose bias voltage can then be changed to change the effective resistance. Note that even when γ is in error, significant improvement is obtained, and in fact it may be desirable to choose γ<1 in order to control the degree of Q enhancement. This consideration applies to all the embodiments described.

The Q-enhanced inductor can be used in any application where inductors are used, including Resonant Circuits, Voltage Controlled Oscillators, Low Noise Amplifiers and Filters. Some examples are given in the following discussion.

Now that the compensated inductor is characterized, its behavior in a resonant circuit can be examined. If a resonating capacitor is placed in parallel with the compensated inductor, the impedance of the parallel combination is given by $$Z_{in} = \frac{j\omega L_{PcompParallel}}{1 - \omega^2 C L_{PcompParallel} + \frac{j\omega L_{PcompParallel}}{R_{Pcomp}}}.$$

Figure 6:
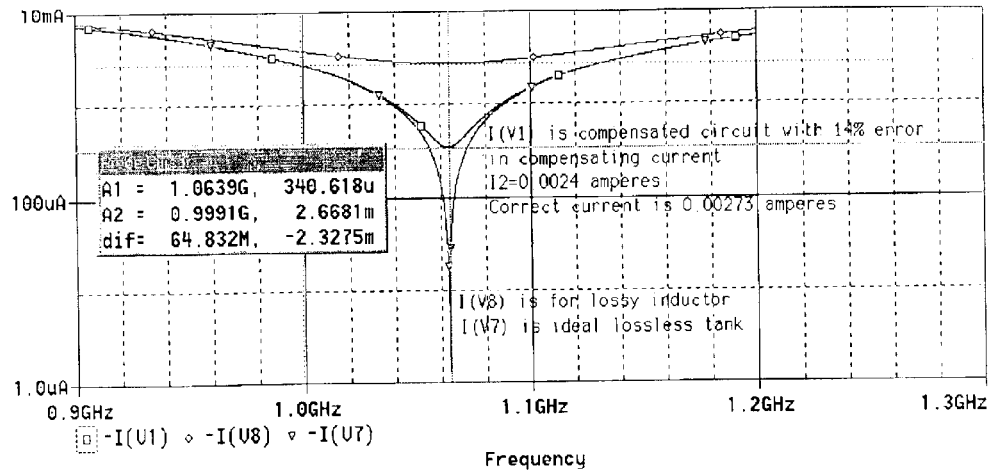
FIG. 6 shows variation of input current with frequency for a resonant circuit with no compensation, compensation with a 14% error factor and perfect compensation.
Figure 7:
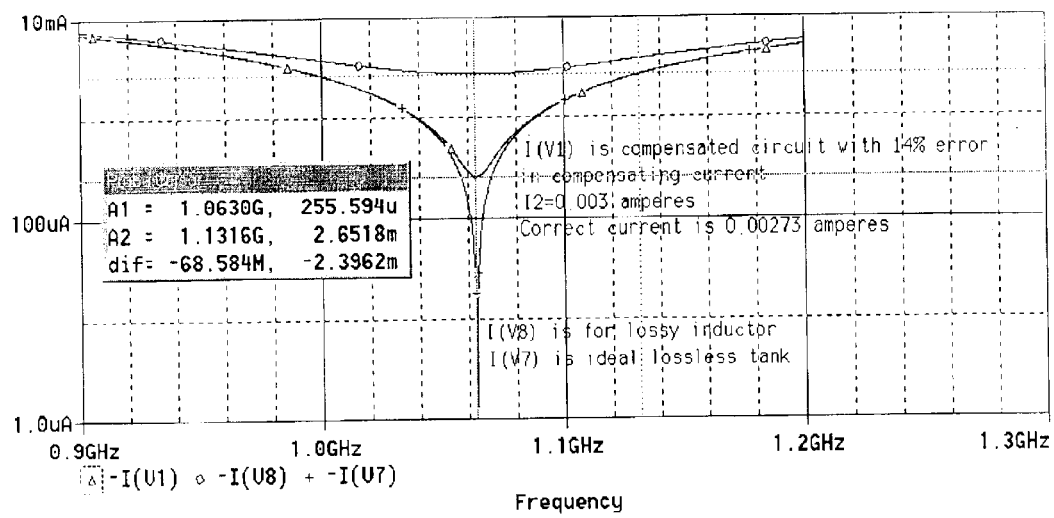
FIG. 7 shows variation of input current with frequency for a resonant circuit with a compensation input current of 3 mA.

When $1-\omega^2 CL_{PcompParallel}=0$, the impedance of the resonant circuit is simply $R_{Pcomp}$, which becomes very large as γ approaches unity. Significant Q enhancement is still obtained when γ is non-unity. For example, if we choose a numerical example where the correct compensating current is 2.73 mA, and instead we have 2.4 mA, the improvement in resonant impedance of 2.6681/0.3406=7.8 times is still achieved, as shown in FIG. 6, which compares input current to the resonant circuit for the cases where there is no compensation (input current at resonance=2.6681 mA), input current when the compensating current is in error by 14% (input current at resonance=340.6 uA), and input current when the coil is properly compensated (input current at resonance=0). Another example with a current of 3 mA instead of 2.73 mA yields a similar result as shown in FIG. 7.

The method for improving the quality factor will now be used in three different examples. It should be noted that these examples are for illustration only and does not limit the method's uses.

Voltage Controlled Oscillators

Figure 8A:
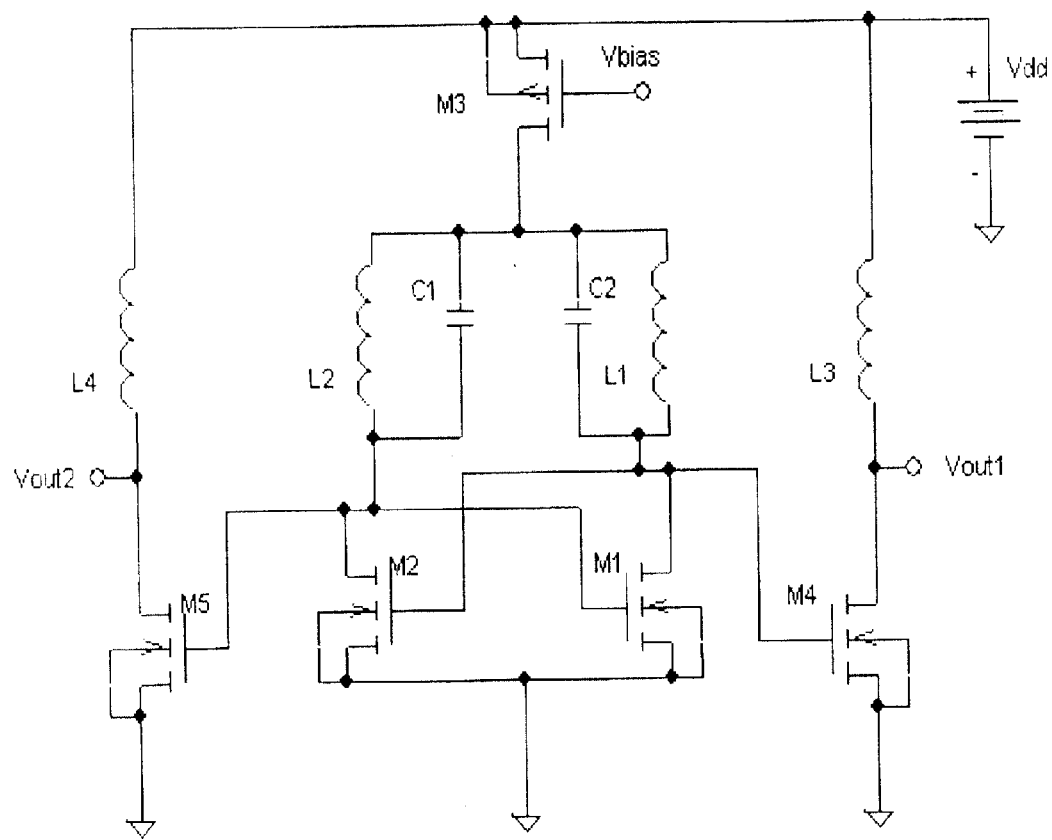
FIG. 8a shows a conventional monolithic voltage controlled oscillator and FIG. 8b shows the voltage controlled oscillator of FIG. 8a modified according to the invention to include a compensated monolithic transformer.

An example of an application is shown in FIG. 8a. This is a conventional LC Voltage Controlled Oscillator (VCO) with buffer stages to isolate the LC tank circuits from the load circuits. The LC tank circuits are formed from the components $L_2$ and $C_1$ in parallel, and $L_1$ and $C_2$ in parallel.

In this circuit, inductors $L_1$ to $L_4$ are individual, with $L_1$ and $L_2$ used in the resonant circuits, and $L_3$ and $L_4$ are load components for the buffer transistors $M_4$ and $M_5$. Because of the low quality factors of the inductors, fairly large bias currents and large transistors are required in order to realize high enough transconductance so that the circuit will oscillate reliably.

This can be seen as follows: At resonance, the parallel L-C tank circuits, have an equivalent resistance of $R_P=(1+Q^2)R_S$, where $R_S$ is the series loss resistance associated with each inductor, and Q was defined previously. The circuit comprising $M_1$, $M_2$, $L_1$, $L_2$, $C_1$ and $C_2$ realizes two voltage amplifiers connected in a loop. The voltage gain from the gate of $M_1$ to its drain is given by $g_m R_P$, as is the gain from the gate of $M_2$ to its drain. The loop gain is therefore $(g_m R_P)^2$, and this is usually designed to have a value of 3 to 5. Since $R_P$ is small when the inherent inductor Q factor is small, a large $$g_m = \sqrt{\frac{2\mu C_{ox} W I_D}{L}}$$

is required, which in turn requires large width to length ratio and high bias current.

Figure 8B:
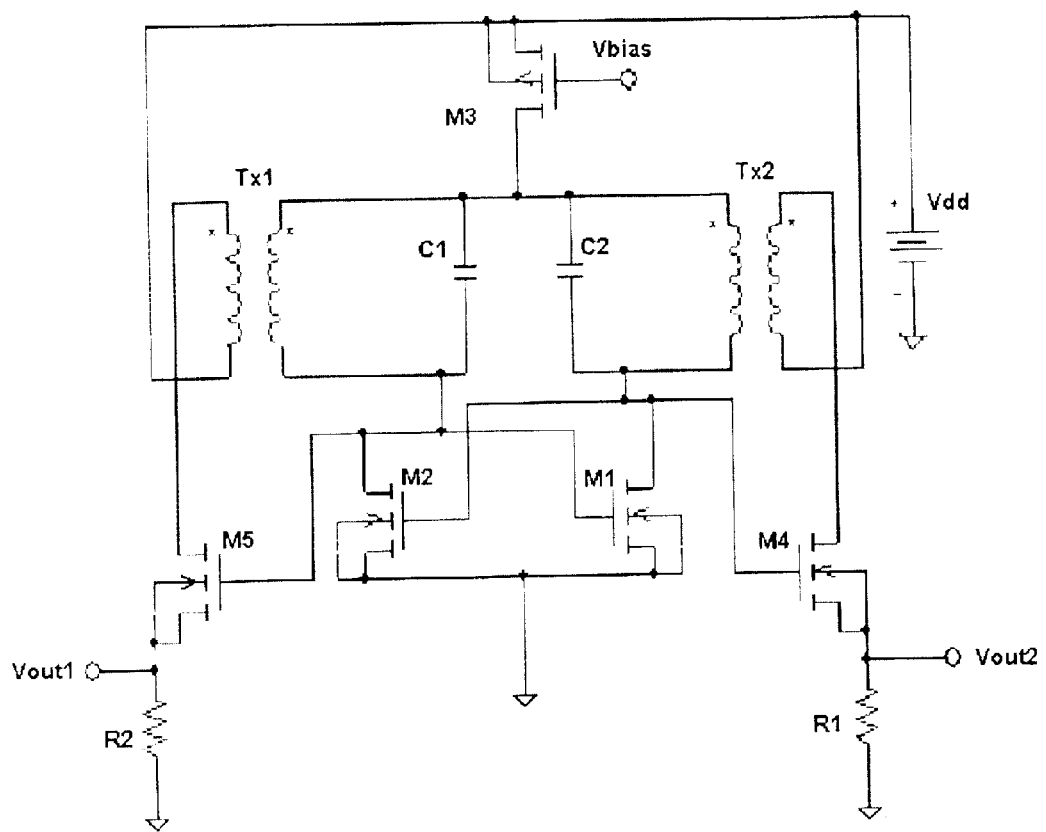

The circuit can be modified to include the transformer compensation. All that is required is to combine $L_1$ and $L_3$, and $L_2$ and $L_4$ to form $Tx_1$ and $Tx_2$ respectively, as shown in FIG. 8b (the gates could also be cross-coupled and transformer leads inverted to get the same functionality).

In this example, resistors $R_1$ and $R_2$ are added and can be properly chosen to provide the correct compensating currents in the transformer secondary windings, according to the methods presented in this patent disclosure, so that the inductances of the primary coils are essentially lossless. This corresponds to large values of $R_P$, and as a result the bias current and transistor dimensions of $M_1$, $M_2$ and $M_3$ can be reduced significantly while still maintaining enough loop gain to ensure oscillation.

Low Noise Amplifiers

Figure 9A:
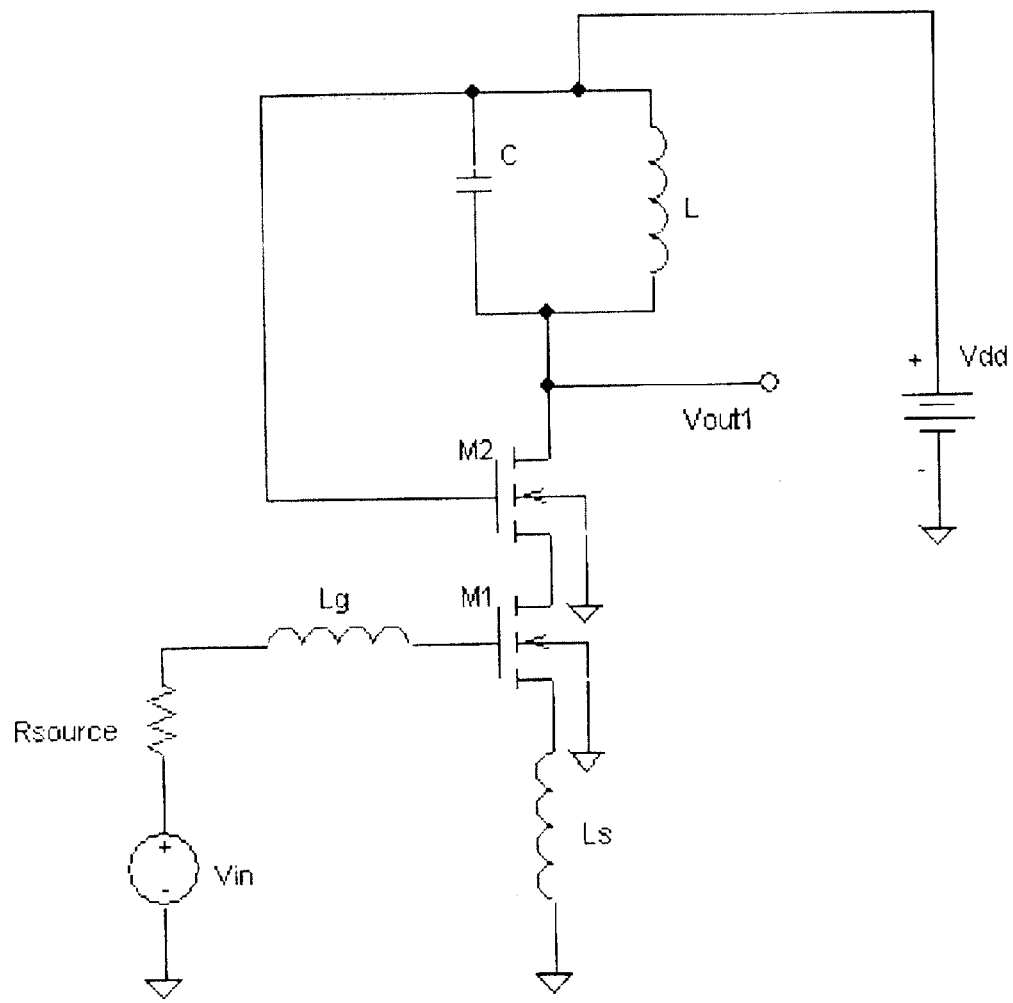
FIG. 9a shows a conventional monolithic low noise amplifier and FIG. 9b shows the low noise amplifier of FIG. 9a modified according to the invention to include a compensated monolithic transformer.

Another RF circuit that commonly requires high quality monolithic inductors is the low noise amplifier (LNA) topology shown in FIG. 9a. The LNA shown is a narrow-band amplifier, where $V_{in}$ and $R_{source}$ represent the signal and resistance of the previous stage, the transistors $M_1$ and $M_2$ are connected in a cascode arrangement, inductors $L_s$ and $L_g$ are used to improve the high frequency response of the LNA, and C and L are connected to the drain of $M_2$ in parallel to improve the gain and frequency response of the LNA.

Figure 9B:
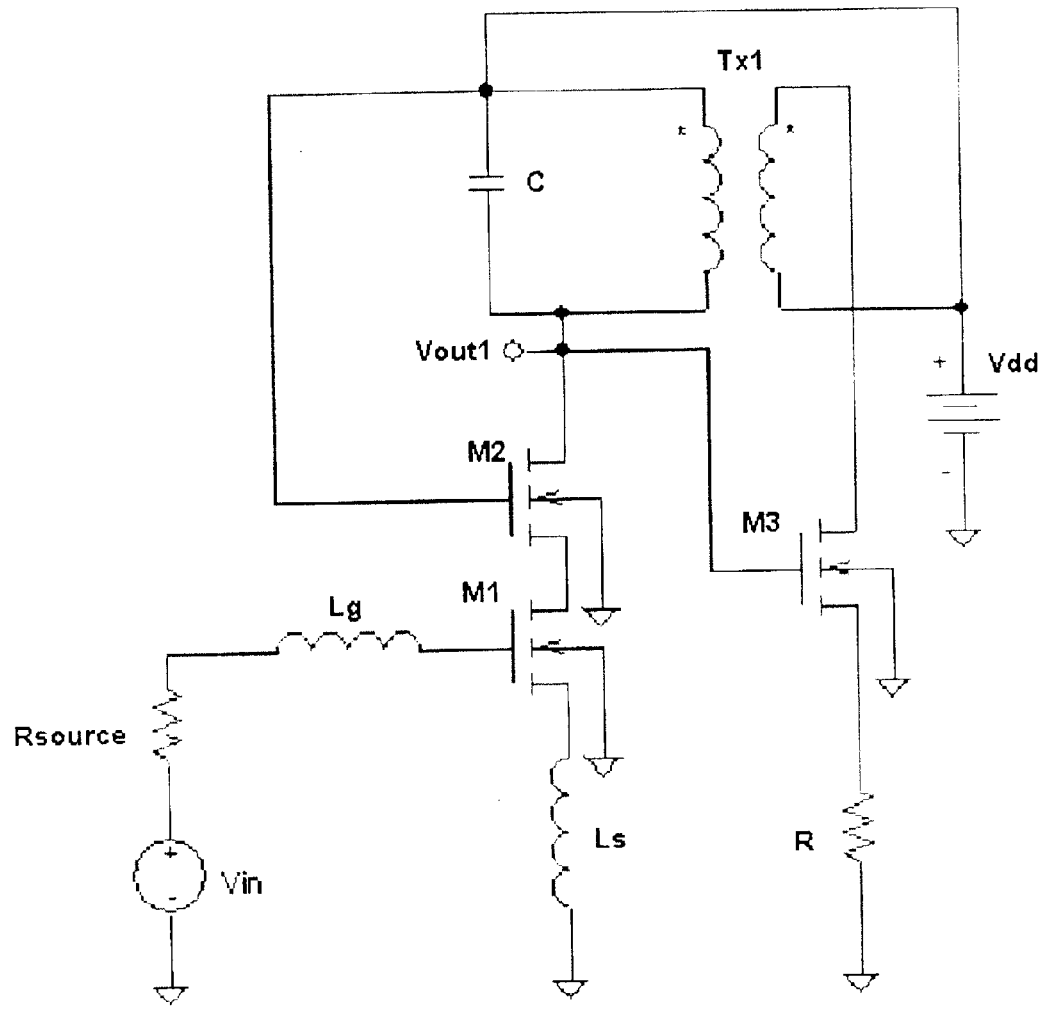

In order to improve the gain of the circuit, the Q-enhanced inductor can be added in a straightforward manner as shown in FIG. 9b by replacing the inductor L with the transformer, transistor $M_3$, and the resistor R, connected to the circuit using the method described before.

Filters

Figure 10A:
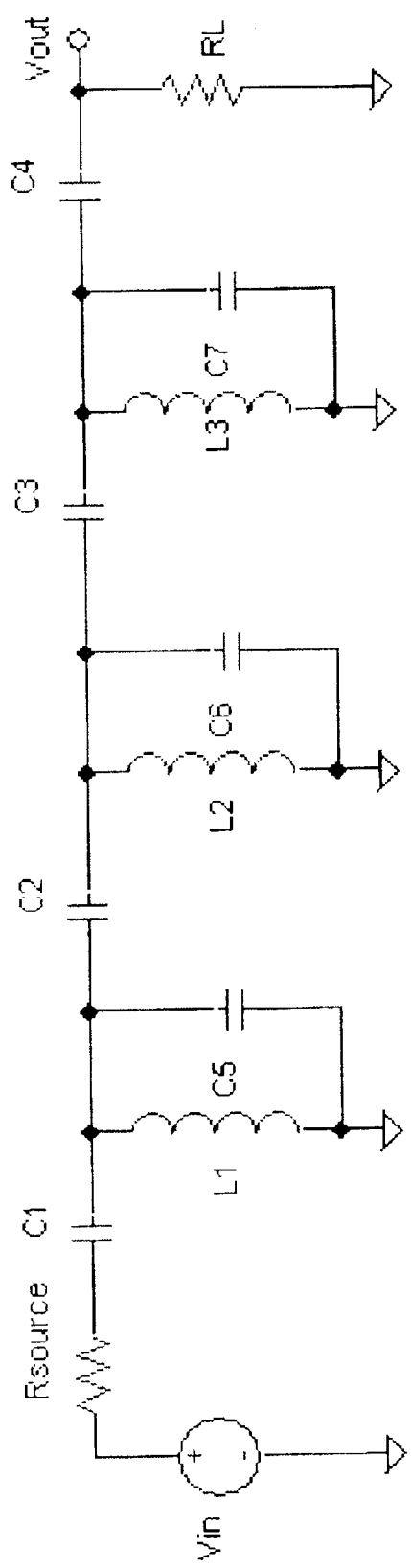
FIG. 10a shows a conventional monolithic filter and FIG. 10b shows the filter of FIG. 10a modified according to the invention to include a compensated monolithic transformer.

Filters come in a wide variety of configurations, but all have inductive components embedded. The higher the Q factor, the better the performance of the filter. An example of a coupled resonator structure is shown in FIG. 10a, forming a band pass filter. $V_{in}$ and $R_{source}$ are the signal and output resistance of the previous stage, $R_L$ represents the resistance of the load, and capacitors $C_1$ through $C_7$ and inductors $L_1$ through $L_3$ are chosen according to common methods used in the field, and determine the characteristics of the band pass filter. The characteristics can also be modified by adding more sections such as the section formed by $L_1$, $C_5$, and $C_2$, and selecting appropriate values by the same methods.

Figure 10B:
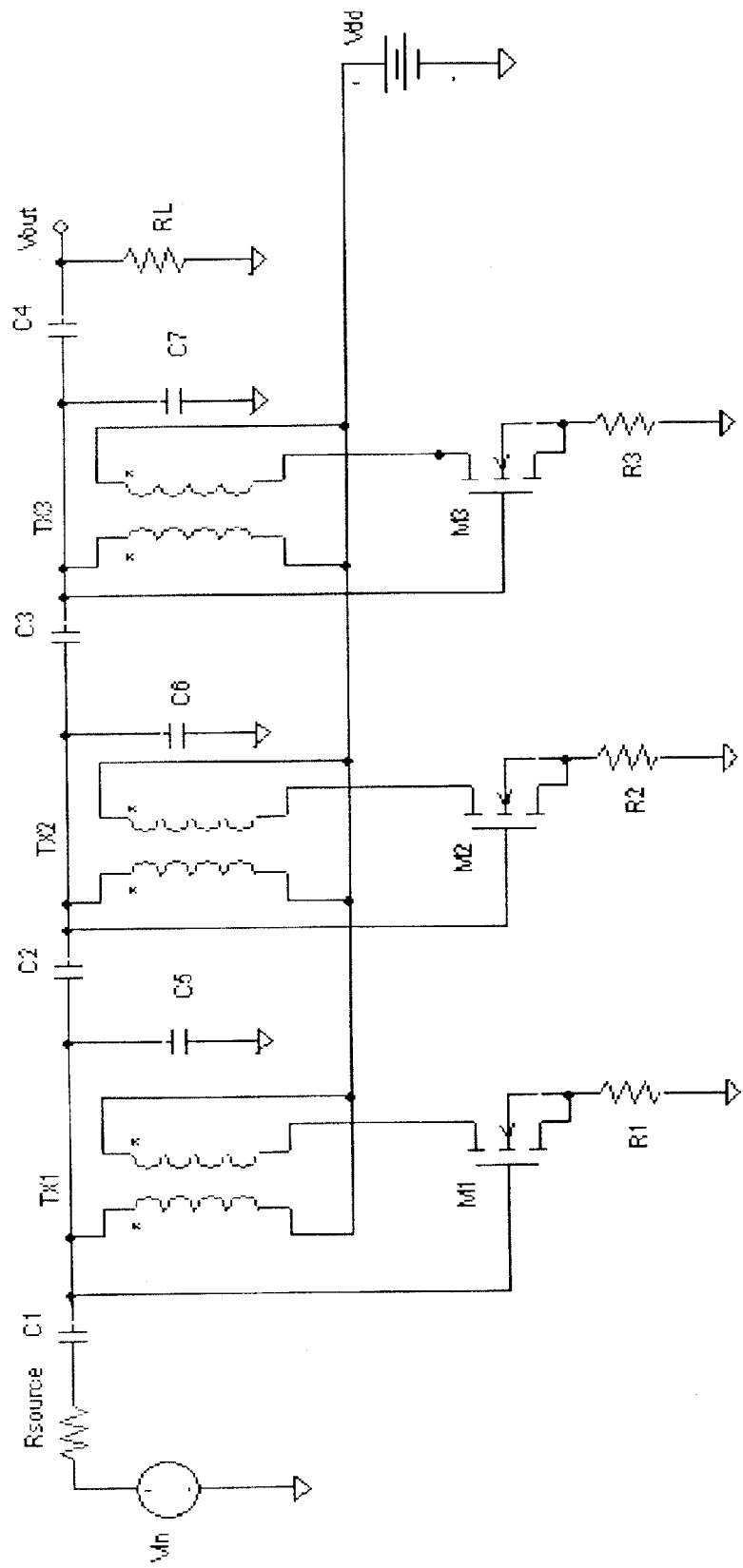

This structure lends itself very well to the Q enhancement technique, as shown in FIG. 10b, where inductors $L_1$, $L_2$, and $L_3$ have been replaced with $Tx_1$, $Tx_2$, and $Tx_3$, respectively. The secondary windings of the transformers are driven by transistors $M_1$, $M_2$ and $M_3$ and resistors $R_1$, $R_2$ and $R_3$, where each are connected using the methods described in this patent disclosure.

Simulations of the VCO circuit behavior in a sophisticated RF circuit simulator called SPECTRE (part of the mainstream commercial IC design package from Cadence Systems) reveal that the technique works very well, allowing a significant decrease in core bias current while maintaining sufficient loop gain to ensure oscillation. In addition, no increase in phase noise is observed, which is very important in VCO design.

Stability

There is a stability issue with the monolithic transformer compensated circuit as described in this patent disclosure. Because the effective loss resistance of the compensated inductor continues to become more negative with increasing frequency at frequencies above the point of zero loss, there will usually be a frequency where the circuit becomes unstable (oscillates) for most input terminations.

This condition may be avoided, and the circuit behavior is substantially improved overall, by the addition of a capacitor C placed in parallel with the secondary windings of the transformer. A preferred embodiment may then look like FIG. 11.

The resistor R in the original compensated circuit of FIG. 2a has been replaced with a second transistor M2 in series with M1, adding the additional benefit of allowing electronic variation of the Q-enhancement with voltage Vcontrol. By varying Vcontrol, the ac current through M1 may be controlled, thus providing tuning of the loss compensation. DC bias to M1 and M2 is provided via Vbias and Vdd as shown, although there are many other ways of providing the bias. Capacitor C is chosen such that the input parameter S11 never leaves the unit circle of the Smith Chart, therefore ensuring stability.

Figure 11:
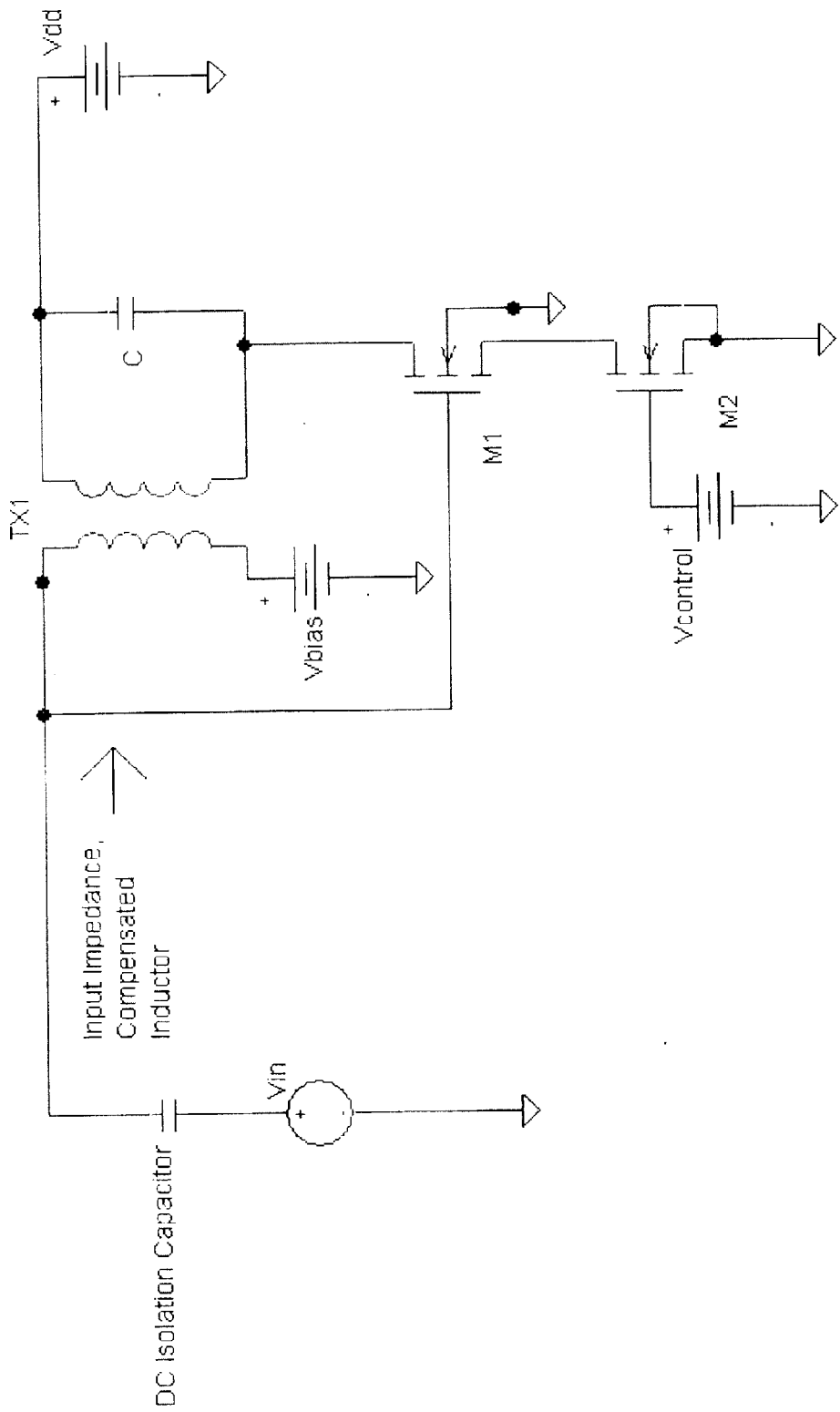
FIG. 11 shows a monolithic transformer compensated circuit, with a capacitor used as a stabilizing element.

The analytic small-signal expression for the input impedance to the circuit as shown in FIG. 11 is given by $$Z_{in} = \frac{R_s\left(1 - \frac{2\omega^2}{\omega_{res}^2}\right) + s\left(L_s + CR_s^2 - \omega^2 L_s^2 C(1-k^2)\right)}{\left(1 - \frac{\omega^2}{\omega_{res}^2}\right) + s\left(CR_s - \frac{g_m L_s k}{1+g_m R_c}\right)},$$

where $$\omega_{res} = 1/\sqrt{L_s C}, \; R_S$$

is the transformer equivalent series loss resistance (assumed to be the same for the primary and secondary circuits), $L_S$ is the equivalent series inductance of each of the primary and secondary windings, $R_C$ is the drain-source resistance of transistor M2 in FIG. 11, k is the transformer coupling coefficient, and $g_m$ is the small-signal transconductance of transistor M1 in FIG. 11.

Figure 12:
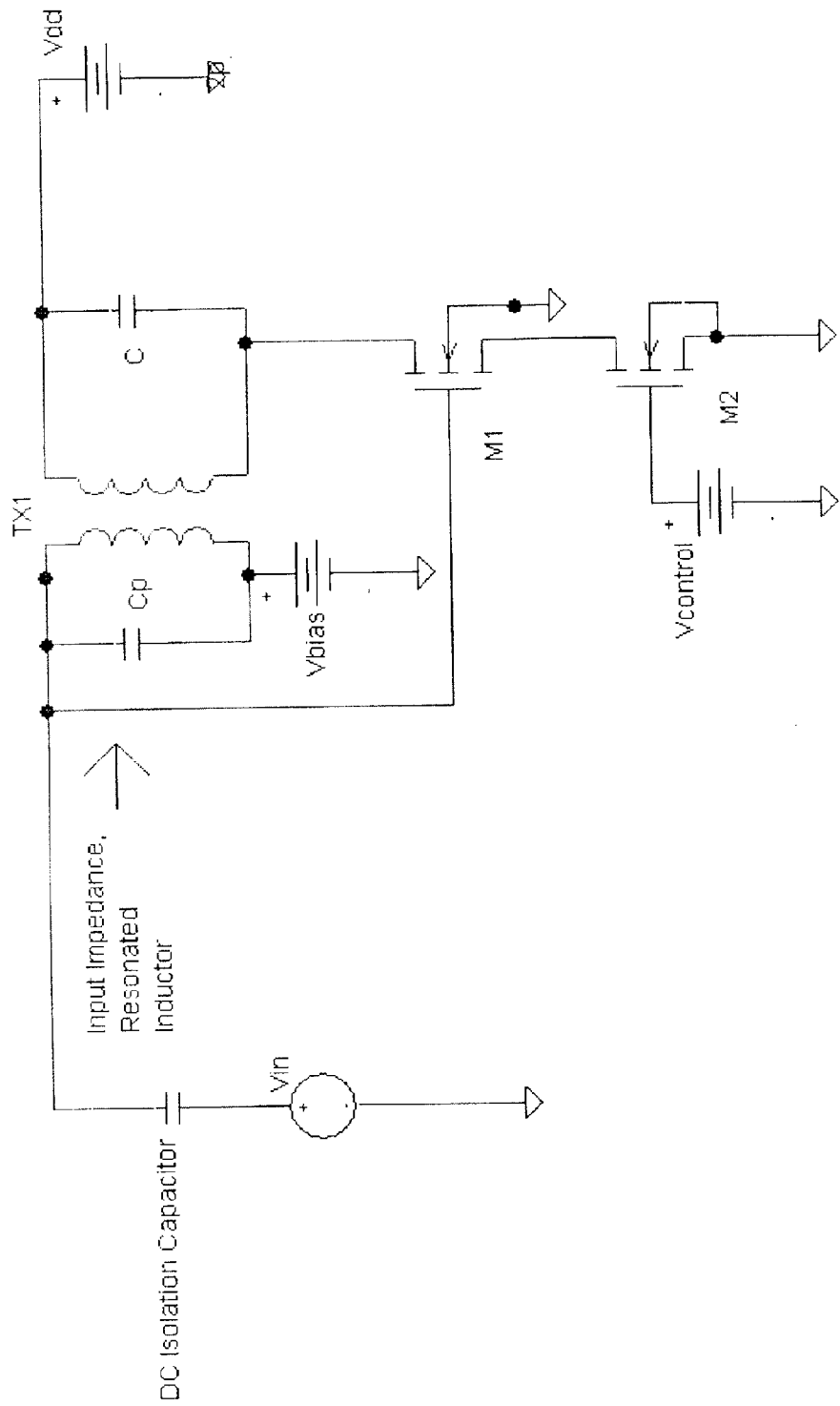
FIG. 12 shows the stabilized monolithic transformer compensated circuit of FIG. 11 in a conventional resonating circuit.

The entire compensated inductor circuit can then be resonated with a capacitor Cp in order to achieve the desired high Q-factor tuned circuit behavior that is used in most RF circuits, as shown in FIG. 12.

The small-signal input impedance to the circuit in this case is given by $$Z_{in} = \frac{\left[R_s\left(1 - \frac{2\omega^2}{\omega_{res}^2}\right) + sL_s\left(1 + \omega_{res}^2 C^2 R_s^2 - \frac{\omega^2}{\omega_{res}^2}(1-k^2)\right)\right]}{\left[1 - \frac{\omega^2}{\omega_{res}^2}\left(1 + \frac{C_p}{C}\right) - \omega^2 CC_p R_s^2 + \frac{\omega^4}{\omega_{res}^4}\frac{C_p}{C}(1-k^2)\right] + s\left[(C+C_p)R_s - \frac{2C_p R_s \omega^2}{\omega_{res}^2} - \frac{g_m L_s k}{1+g_m R_c}\right]}$$

This circuit exhibits a resonant peak with controllable Q-factor by varying $g_m$ or $R_C$, or alternatively by varying C.

The behavior of S11 with frequency for a range of values of C can be analyzed using a conventional Smith Chart, and using reasonable values assigned to the other components and the constants set forward in the immediately preceding equations. A value of C can be chosen (as for example, 9 pF) so that the circuit resonates with infinite Q as the curve crosses the real axis, and then remains inside the circle for all higher frequencies. A value of C for a given circuit may be obtained analytically, or through adjustment of parameters in a simulator. Another way to stabilize the circuit is to use a parallel L-C tuned circuit with a low Q inductor placed in the circuit instead of or in series with the control transistor M1.

Figure 13:
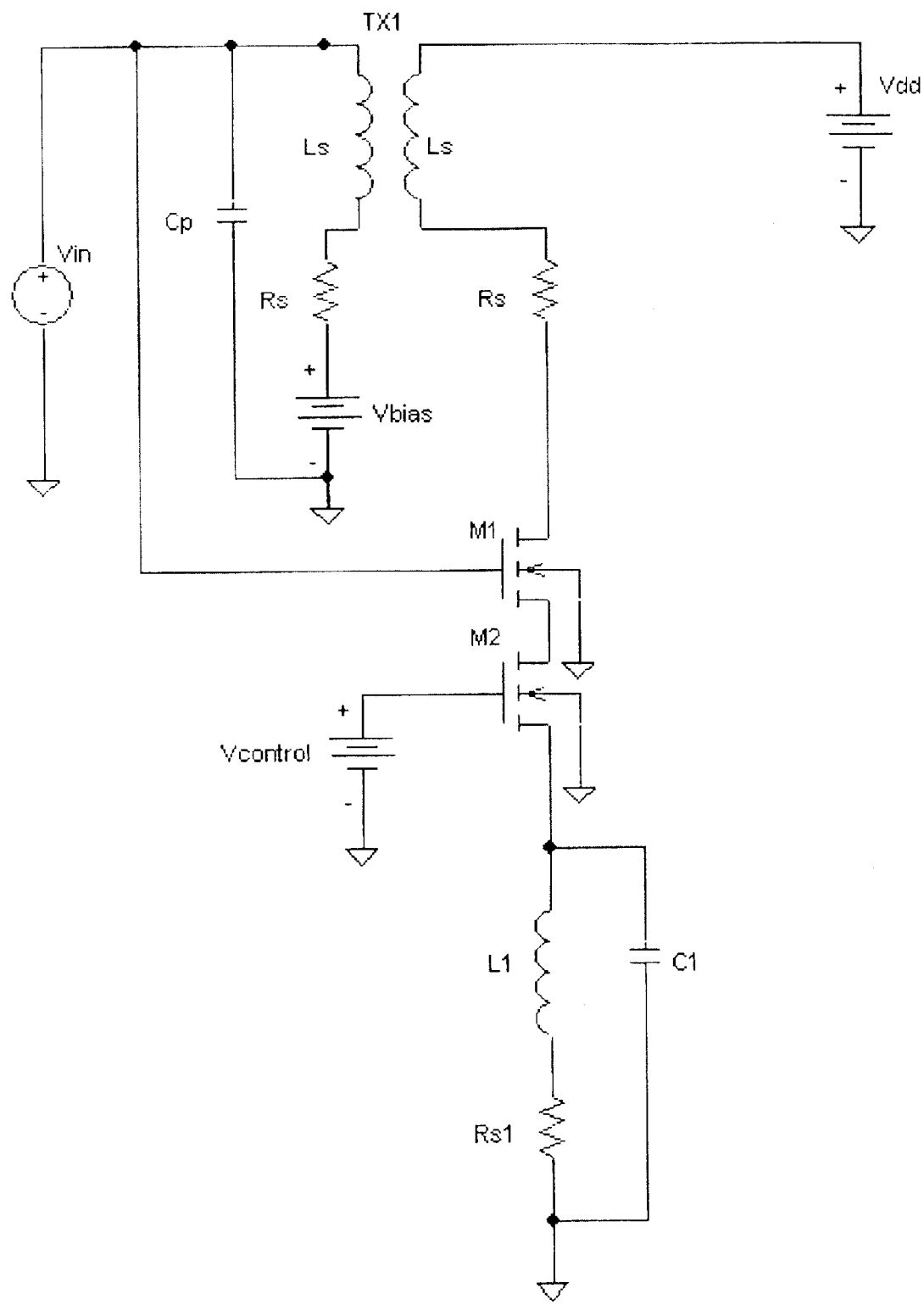
FIG. 13 shows a monolithic transformer compensated circuit, with an LC circuit used as a stabilizing element.

A means to prevent oscillation in the Q-enhanced inductor circuit is shown in FIG. 13. In this case, instead of resonating the secondary transformer winding with a capacitor, a frequency selective LC circuit formed of L1, Rs1 and C1, is placed in series with the source lead of the control transistor M2. Other ways of providing a bandpass filter on the ac current source may be used. This circuit reduces the compensation current at frequencies above the primary resonant frequency, thereby stabilizing the circuit. This technique has the advantage of allowing higher resonant frequencies in the primary circuit with smaller component values, and it does not significantly alter the resonant frequency of the primary L-C circuit compared to the unstabilized circuit. The other stabilization technique using the capacitor C reduces the resonant frequency considerably. In addition, the L1 inductor is quite small and can be quite lossy and is easy to fabricate on chip.

Immaterial modifications may be made to the circuit described here without departing from the invention.

We claim:

1. A monolithic transformer compensated circuit, comprising:
   a monolithic transformer having a primary winding and a secondary winding;
   a source of voltage connected to apply an ac voltage to the primary winding of the monolithic transformer;
   a current source connected to drive ac current into the secondary winding of the monolithic transformer; and
   the current source being configured to drive an ac current into the secondary winding that is proportional to the ac voltage in the primary winding and that has a phase relationship with the ac voltage in the primary winding to achieve loss compensation in the primary winding.

2. The monolithic transformer compensated circuit of claim 1 in which the ac current driven into the secondary winding is in a fixed phase relation with the ac voltage in the primary winding.

3. The monolithic transformer compensated circuit of claim 2 in which the ac current is in phase with the ac voltage.

4. The monolithic transformer compensated circuit of claim 1 in which the ac current is selected for maximum compensation at a pre-selected frequency.

5. The monolithic transformer compensated circuit of claim 4 in which the pre-selected frequency is greater than 1 GHz.

6. The monolithic transformer compensated circuit of claim 1 in which the ac current is derived from the source of ac voltage.

7. The monolithic transformer compensated circuit of claim 6 further comprising a source follower circuit formed using a transistor having a gate and drain, the ac voltage being applied to the gate of the transistor simultaneously with the application of the ac voltage to the primary winding, and the drain of the transistor acting as the current source.

8. The monolithic transformer compensated circuit of claim 1 configured as a circuit element in a resonant circuit.

9. The monolithic transformer compensated circuit of claim 1 configured as a circuit element in a voltage controlled oscillator.

10. The monolithic transformer compensated circuit of claim 1 configured as a circuit element in a low noise amplifier.

11. The monolithic transformer compensated circuit of claim 1 configured as a circuit element in a filter.

12. The monolithic transformer compensated circuit of claim 1 in which the ac current has a fixed value, for use of the monolithic transformer compensated circuit in narrowband applications.

13. The monolithic transformer compensated circuit of claim 1 in which the ac current has a value that varies with the inverse of the square of the frequency of the ac voltage for use of the monolithic transformer compensated circuit in wideband applications.

14. The monolithic transformer compensated circuit of claim 1 further comprising a control circuit for the current source to allow tuning of the loss compensation.

15. A method of designing a monolithic transformer compensated circuit, the method comprising the steps of:
   providing a source of ac voltage to apply an ac voltage to a primary winding of a monolithic transformer;
   providing a source of ac current to apply an ac current to a secondary winding of the monolithic transformer; and
   selecting the ac current to be proportional to the ac voltage in the primary winding, within an error factor $\gamma \approx 1$, where an error factor $\gamma = 1$ represents perfect loss compensation, and in phase with the ac voltage in the primary winding, to achieve loss compensation in the primary winding with a controllable Q that is dependent on the error factor $\gamma$.

16. A monolithic transformer compensated circuit, comprising:
   a monolithic transformer having a primary winding and a secondary winding;
   a source of voltage connected to apply an ac voltage to the primary winding of the monolithic transformer;
   a current source connected to drive ac current into the secondary winding of the monolithic transformer;
   the current source being configured to drive an ac current into the secondary winding that is proportional to the ac voltage in the primary winding and that has a phase relationship with the ac voltage in the primary winding to achieve loss compensation in the primary winding; and
   a circuit stabilizing element connected to the monolithic transformer.

17. The monolithic transformer compensated circuit of claim 16 further comprising a control circuit for the current source to allow tuning of the loss compensation.

18. The monolithic transformer compensated circuit of claim 16 in which the circuit stabilizing element is a capacitance in parallel to the secondary winding.

19. The monolithic transformer compensated circuit of claim 16 in which the circuit stabilizing element is a filter circuit arranged to suppress unwanted frequency operation of the current source.

20. The monolithic transformer compensated circuit of claim 19 in which the circuit stabilizing element is an LC circuit placed in series with the current source.

21. The monolithic transformer compensated circuit of claim 20 further comprising a control circuit for the current source to allow tuning of the loss compensation.

22. The monolithic transformer compensated circuit of claim 21 in which:
   the control circuit comprises a voltage controlled transistor having a source lead; and
   the circuit stablizing element comprises an LC circuit placed in series with the source lead of the control circuit to stabilize the monolithic transformer compensated circuit.

* * * * *